(12) United States Patent
Ogawa et al.

(10) Patent No.: US 11,835,465 B2
(45) Date of Patent: Dec. 5, 2023

(54) DETECTING METHOD AND DETECTING DEVICE OF GAS COMPONENTS AND PROCESSING APPARATUS USING DETECTING DEVICE OF GAS COMPONENTS

(71) Applicant: Hitachi High-Tech Corporation, Tokyo (JP)

(72) Inventors: Yoshifumi Ogawa, Tokyo (JP); Yutaka Kouzuma, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 879 days.

(21) Appl. No.: 16/646,487

(22) PCT Filed: Feb. 15, 2019

(86) PCT No.: PCT/JP2019/005467
§ 371 (c)(1),
(2) Date: Mar. 11, 2020

(87) PCT Pub. No.: WO2020/166048
PCT Pub. Date: Aug. 20, 2020

(65) Prior Publication Data
US 2021/0231571 A1 Jul. 29, 2021

(51) Int. Cl.
*G01N 21/73* (2006.01)
*C23C 16/52* (2006.01)
(Continued)

(52) U.S. Cl.
CPC ............. *G01N 21/73* (2013.01); *C23C 16/52* (2013.01); *H01J 37/32* (2013.01);
(Continued)

(58) Field of Classification Search
CPC ............... H01J 37/32; H01J 37/32834; H01J 2237/24592; C23C 16/52; G01N 21/67;
(Continued)

(56) References Cited

U.S. PATENT DOCUMENTS 4,609,426 A 9/1986 Ogawa et al.
5,817,534 A 10/1998 Ye et al.
(Continued)

FOREIGN PATENT DOCUMENTS

JP S58084431 A 5/1983
JP S60247924 A 12/1985
(Continued)

OTHER PUBLICATIONS

Office Action dated May 3, 2021 in Korean Application No. 10-2020-7004962.
(Continued)

*Primary Examiner* — Yuechuan Yu
(74) *Attorney, Agent, or Firm* — Miles & Stockbridge, P.C.

(57) ABSTRACT

Provided is a detecting device of gas components that includes a gas component detecting unit for detection of a light emission of plasma that is formed by re-excitation downstream of an arrangement position of an object to be processed. The gas component detecting unit includes an introduced gas supply portion that supplies an introduced gas, a nozzle portion that is provided with a hole through which the introduced gas that is supplied from the introduced gas supply portion passes through and an opening through which a part of a gas to be analyzed flowing through an exhaust pipe portion is introduced into an inside of the hole, the opening being provided in an intermediate portion of the hole, a discharge electrode portion that generates plasma inside the nozzle portion by causing the gas to be
(Continued)

analyzed that is introduced from the opening into an inside of the nozzle portion and the introduced gas that is supplied into the inside of the hole to discharge, and a light emission detecting unit that detects a light emission of the plasma generated inside the nozzle portion by the discharge electrode portion.

5 Claims, 3 Drawing Sheets

(51) Int. Cl.
    *H01J 37/32*     (2006.01)
    *H01L 21/67*     (2006.01)
    *H05H 1/24*     (2006.01)
    *H01L 21/66*     (2006.01)

(52) U.S. Cl.
    CPC .. *H01J 37/32834* (2013.01); *H01L 21/67253* (2013.01); *H05H 1/24* (2013.01); *H01J 2237/24592* (2013.01); *H01L 21/67069* (2013.01); *H01L 22/26* (2013.01)

(58) Field of Classification Search
    CPC ................ G01N 21/73; H01L 21/3065; H01L 21/67253; H01L 22/26; H01L 21/67069; H05H 1/0037; H05H 1/0012; H05H 1/24
    See application file for complete search history.

(56) References Cited

U.S. PATENT DOCUMENTS

| | | |
|---|---|---|
| 5,830,310 A | 11/1998 | Doi |
| 5,892,364 A | 4/1999 | Monagle |
| 5,902,403 A | 5/1999 | Aitani et al. |
| 6,159,388 A | 12/2000 | Yanagisawa et al. |
| 6,592,817 B1 | 7/2003 | Tsai et al. |
| 6,923,189 B2 | 8/2005 | Lakshmanan et al. |
| 7,201,174 B2 | 4/2007 | Fukiage |
| 2004/0235299 A1 | 11/2004 | Srivastava et al. |
| 2004/0253828 A1 | 12/2004 | Ozawa et al. |
| 2009/0035945 A1 | 2/2009 | Fujii et al. |
| 2010/0201978 A1 | 8/2010 | Hori et al. |
| 2010/0224322 A1* | 9/2010 | Sui ................... H01J 37/32963 156/345.25 |

FOREIGN PATENT DOCUMENTS

| | | |
|---|---|---|
| JP | H08096988 A | 4/1996 |
| JP | H08193271 A | 7/1996 |
| JP | H09143742 A | 6/1997 |
| JP | H10226892 A | 8/1998 |
| JP | H11045679 A | 2/1999 |
| JP | 2002033312 A | 1/2002 |
| JP | 2002057149 A | 2/2002 |
| JP | 2002151475 A | 5/2002 |
| JP | 2002270513 A | 9/2002 |
| JP | 2004031398 A | 1/2004 |
| JP | 2004109828 A | 4/2004 |
| JP | 2005033173 A | 2/2005 |
| JP | 2006210415 A | 8/2006 |
| JP | 2007501534 A | 1/2007 |
| JP | 2008243492 A | 10/2008 |
| JP | 2013191875 A | 9/2013 |
| JP | 2016058361 A | 4/2016 |
| JP | 2017156188 A | 9/2017 |

OTHER PUBLICATIONS

Tamura et al. "Pulsed Dry Methane Reforming in DBD-Catalyst Hybrid reaction and Reaction Mechanisms", Journal of the Institute of Electrostatics Japan, vol. 40, 1, 2016, pp. 8-13.

International Search Report dated Apr. 16, 2019 issued in PCT/JP2019/005467.

* cited by examiner

[FIG. 1]
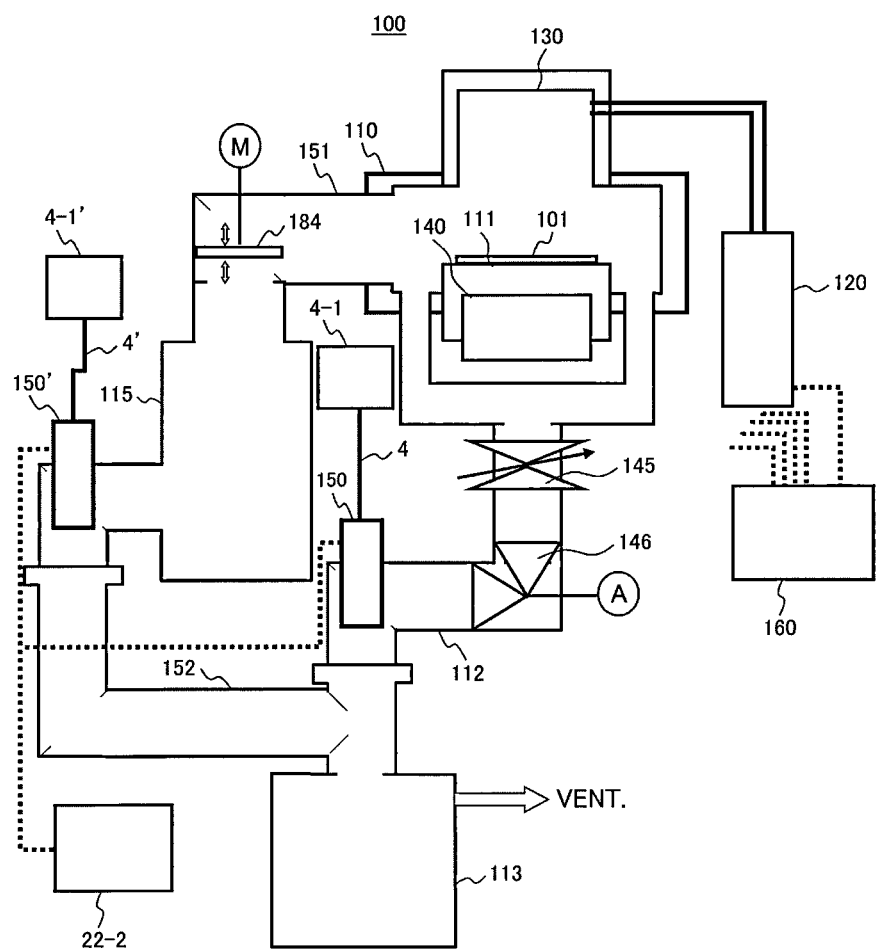

[FIG. 2]
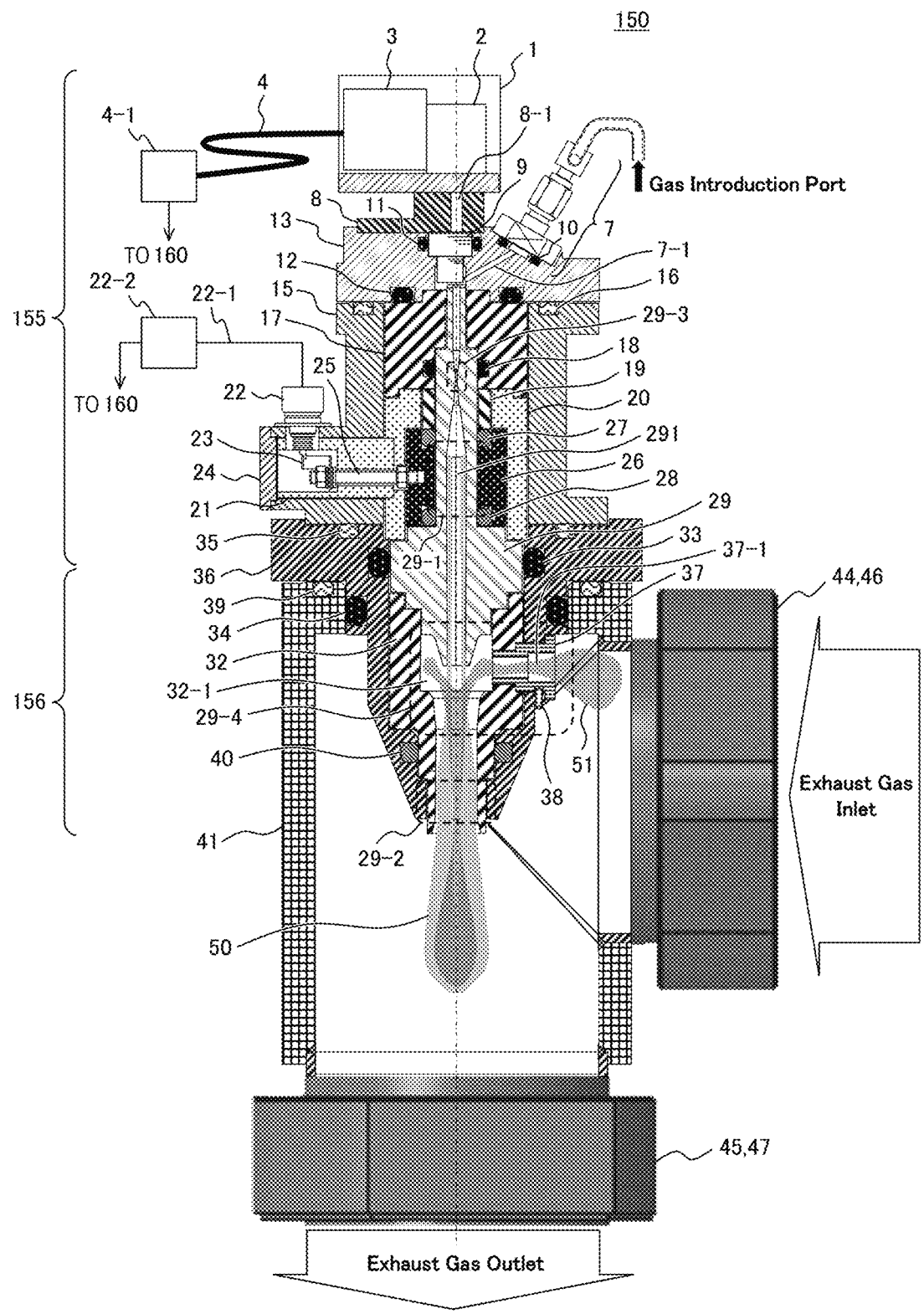

[FIG. 3]
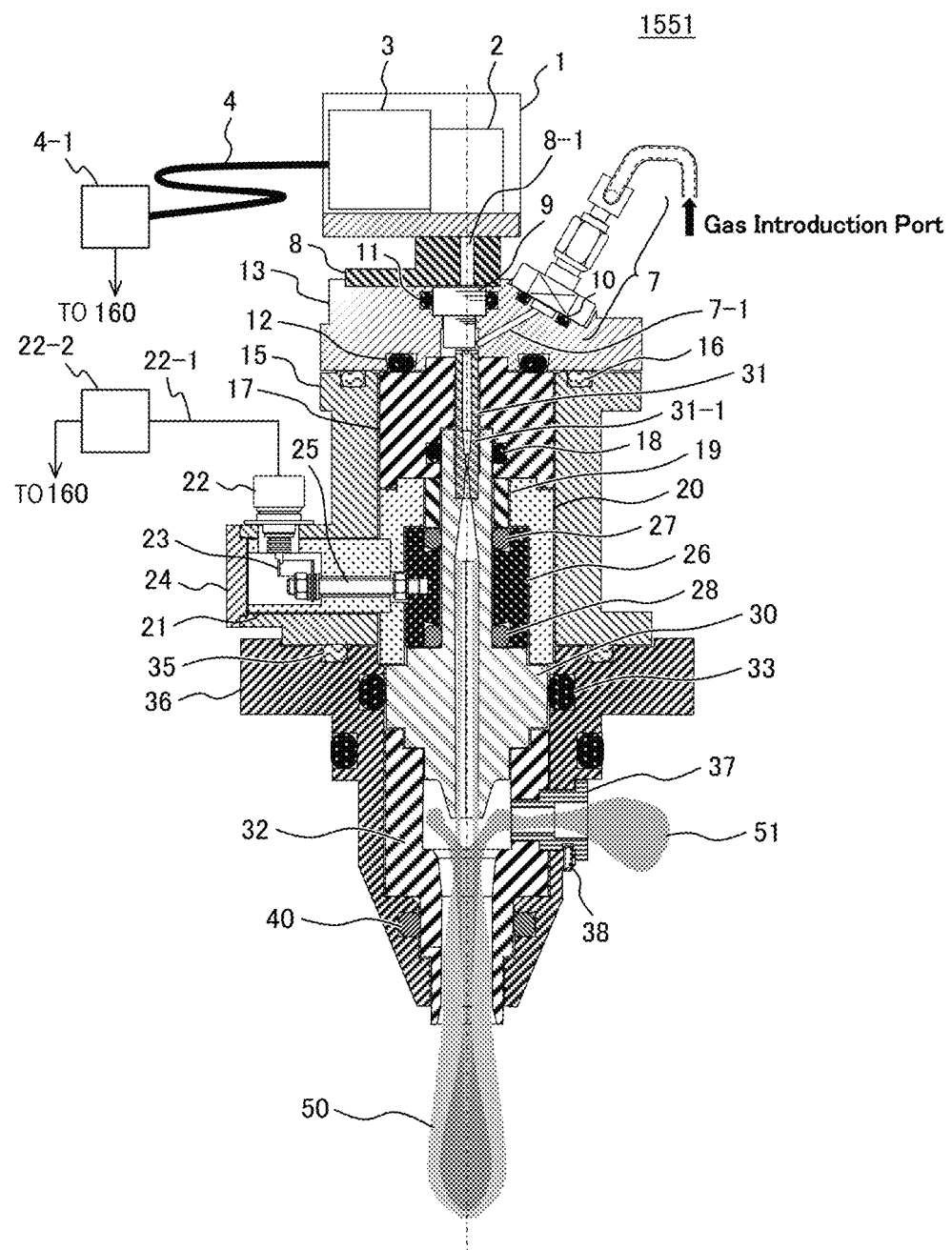

DETECTING METHOD AND DETECTING DEVICE OF GAS COMPONENTS AND PROCESSING APPARATUS USING DETECTING DEVICE OF GAS COMPONENTS

TECHNICAL FIELD

The present invention relates to a method for detecting gas components of a processing apparatus that uses a processing gas to process an object to be processed in processing such as etching, CVD, asking, and surface modification and detecting processing completion (detecting an end point), a detecting device of gas components, and a processing apparatus using the detecting device of gas components.

BACKGROUND ART

A manufacturing apparatus performs processing on a material to be processed such as a wafer using a gas, referred to as a processing gas, that has various properties and high purity. The manufacturing apparatus is now an indispensable and important industrial machine in manufacturing a semiconductor and an electric element such as a liquid crystal and a solar cell. The processing gas is introduced into a processing chamber or a reaction reactor (a chamber) through a flow rate controller such as a mass flow controller or a gas valve in accordance with information of steps in a processing recipe. The processing gas is converted into plasma and reacts at a high temperature to perform processing such as etching, CVD, asking, surface modification, and diffusion on a material to be processed.

For example, when the plasma is brought into direct contact with the material to be processed or a wall surface to perform etching or cleaning, light emissions of the plasma from the chamber are separated (by a wavelength) so that an over-time change in a light emission intensity of a specified gas component is detected. Accordingly, a completion time (an end point) of the etching processing or a completion time (an end point) of the cleaning on the wall surface can be detected. Such a detecting method is referred to as an optical emission spectroscopy (OES) method.

Other methods for detecting gas components in a chamber and an end point include a method based on different principles such as ion mass spectrometry, gas chromatography, and atom (molecule) gas optical absorption, an interference film thickness monitor (FTM) method for measuring a film thickness based on thin film interference light of an object to be processed, and a method for detecting a progressing state of processing by a crystal film thickness detector or the like in which an actual film is adhered to a crystal vibrator and the crystal film thickness detector measures a thickness of the film according to a change in a dielectric capacity. Among these detecting methods, the above-described OES is frequently used in detection of an endpoint in an actual processing apparatus since the OES is good and accurate in correspondence and the apparatus (a system) is simple.

However, processing is performed using an excited gas as a radical with charged particles (ions and electrons) removed by introducing a gas from the generated plasma to the material to be processed or the wall surface through a buffer plate (formed of quartz or aluminum) that has a plurality of through holes, or that processing is performed by exciting a gas by a catalyst or heat without ionizing gas components using a catalytic chemical vapor deposition (CAT-CVD), hot wire CVD, or hot wire etching. In such processing in which a so-called radical reaction is a main part, since gas components do not emit a sufficient bright line spectrum at a light emission detecting wavelength (usually about 250 nm to 800 nm), it is difficult to obtain a clear signal spectrum using the OES.

Energy is lower in the radical reaction than in a plasma reaction and accordingly recombination accompanying cracking or ionization of molecules is not actively performed. This is because light having a wavelength specific to a molecule (an atom) is emitted corresponding to a difference between energy when an electron returns to a neutral molecule by recombination and energy when an electron returns to a lower stable level.

JP-A-S58-84431 (PTL 1) dated long time ago proposed a method for solving this problem in which an exhausted gas is re-converted into plasma using another plasma source to perform a light emission analysis. In this method, as described in JP-A-S60-247924 (PTL 2), it is known that a light emission spectrum stands out and has a good S/N ratio at a lower pressure side.

In addition, JP-A-2013-191875 (PTL 3) dated recently discloses a method for solving this problem in which a downstream gas is converted into plasma in a similar manner and an electric property of the plasma is used to detect an end point.

On the other hand, U.S. Pat. No. 5,892,364 (PTL 4) discloses a detecting method in which a processing gas is re-converted into plasma using a plasma source that utilizes dielectric barrier discharge.

CITATION LIST

Patent Literature

PTL 1: JP-A-S58-84431
PTL 2: JP-A-S60-247924
PTL 3: JP-A-2013-191875
PTL 4: U.S. Pat. No. 5,892,364

Non-Patent Literature

Non-patent Literature 1: Tamura etl. *Pulsed Dry Methane Reforming in DBD-Catalyst Hybrid reaction and Reaction Mechanisms*, Journal of the Institute of Electrostatics Japan, Vol. 40, 1, 2016

SUMMARY OF INVENTION

Technical Problem

In a method for detecting a light emission by exciting, using another plasma source, an exhausted gas from a chamber under a negative pressure under which processing is performed, a still active gas unreacted in the processing is present in the exhausted gas, and accordingly, a surface of a light collection view port (usually formed of quartz or light transmissive alumina) may be contaminated due to corrosion or reaction, or a light emission intensity may decrease over time due to adherence of deposit components.

Similarly, the active gas may deteriorate, corrode and shave a metal member that forms an electrode of a discharge unit. It is desirable that an electrode portion is formed of a material that is difficult to be shaved and can be easily replaced.

The following four points are important for the purpose of detecting gas components. First, how many target gas components in the exhausted gas are introduced into re-excited plasma is important for improving the S/N ratio and performing a stable detection. Second, it is important to construct plasma that has an electron temperature, a plasma density, or a vacuum ultraviolet light emission component that are sufficient to emit light, and has sufficient energy to cause components in the exhausted gas to emit light.

Third, how to collect light from a plasma light emission unit and efficiently capture plasma light are necessary. Fourth is a problem about response and time constant. Since the S/N ratio decreases when gas components from deposits of a reaction product at a periphery of the discharge unit are mixed at a re-discharge unit that detects an end point, it is important to conceive a method in which deposits are not generated in the re-discharge unit.

The invention provides, in a method for detecting a light emission of the plasma formed by re-excitation downstream of an arrangement position of an object to be processed, a structure of a plasma source that has good maintenance in a discharge unit, can prevent deposits, and has sufficient active energy for efficient light collection. In addition, the invention provides an efficient detecting method, a detecting device, and a processing apparatus using the detecting device.

Solution to Problem

In order to solve the problems described above, the invention provides a method for detecting, using a detecting device of gas components, components of a gas to be analyzed that is exhausted from a processing apparatus and flows through an exhaust pipe portion by an emission spectrometer. The detecting device of gas components includes a nozzle portion, a hole that passes through the nozzle portion, a light emission detecting unit disposed at an opposite end portion of the hole with respect to one end of the hole in the nozzle portion, and an introduced gas supply portion disposed between the light emission detecting unit and the nozzle portion. According to the method, an additional gas is supplied from an outside to the detecting device of gas components. The gas is introduced from a gas supply portion into an inside of the hole that passes through the nozzle portion of the detecting device of gas components. A part of a gas to be analyzed that flows through the exhaust pipe portion is introduced into the inside of the hole from an opening provided in an intermediate portion of the nozzle portion of the hole between the one end of the hole in the nozzle portion and the introduced gas supply portion. In a region including a section where the gas to be analyzed is introduced from an introduced gas supply portion inside the hole of the nozzle portion, a discharge electrode provided in the detecting device of gas components discharges to generate plasma using the gas to be analyzed and the introduced gas. A light emission of the generated plasma passes through the hole of the nozzle portion and is detected by a light emission detecting unit of the detecting device of gas components. Components of the gas to be analyzed are detected based on information of the light emission of the plasma that is detected by the light emission detecting unit.

With regard to the above-described problem that the view port for light collection is contaminated, an inert gas such as argon (Ar) may be used in a supply gas so that the problem can be solved by covering a gas contacting portion of the view port for light collection with the inert gas. With regard to the above-described problem that the metal member of the electrode of the discharge unit is deteriorated or corroded, dielectric barrier discharge is used in which a surface of the metal member of the electrode is covered with a dielectric, so that the problem can be solved by keeping the metal member clean and replacing only a wear-out dielectric. According to the invention, since a gas to be analyzed that is exhausted from a processing apparatus is introduced by a so-called vacuum ejector, more components of the gas to be analyzed that flows through the exhaust pipe portion can be introduced into re-excited plasma. Considering pressure in an exhaust pipe to which the detecting device of gas components is attached, it is needless to say that a flow rate of the supply gas and shapes of the nozzle and the opening that form the ejector are optimized to provide a pressure suitable for the dielectric barrier discharge.

With regard to the above-described problem of plasma energy, an introduced gas that is supplied to the dielectric barrier discharge is a gas in which not only the argon (Ar) but also helium (He) are mixed, so that the problem can be solved by obtaining greater dissociation energy.

In addition, an inner surface of the nozzle where plasma is generated can be observed from the view port for light collection that is provided at an end portion, so that a light emission can be collected more efficiently.

With regard to the above-described problem of an influence of deposits on response and time constant, the detecting device of gas components generates plasma before starting processing of an object to be processed in a reactor (a chamber), so that the problem can be solved by cleaning deposits in the nozzle during this time.

Advantageous Effect

According to the invention, exhausted gas components are formed into plasma by additional dielectric barrier discharge or the like that is provided downstream of an object to be processed, and a light emission by the exhausted gas components is collected and detected upstream of an introduced gas in a discharge unit. An ejector function actively introduces an exhausted gas into plasma. Accordingly, in processing of the object to be processed in which a radical reaction is a main part, a progressing state of the reaction and an endpoint can be efficiently detected without a time lag, and an S/N ratio can be improved.

According to the invention, a detecting method and a detecting system (a detecting device) that are good in maintenance and have no mechanical difference and a processing apparatus using the detecting system can be provided by collectively including these functions in one flange and managing quality and performance of the detecting system.

BRIEF DESCRIPTION OF DRAWINGS

FIG. 1 is a block diagram showing a schematic configuration of a processing apparatus according to the invention.

FIG. 2 is a schematic diagram showing a detecting device for gas components provided on an exhaust path according to the invention.

FIG. 3 is a schematic diagram showing another embodiment of the invention.

DESCRIPTION OF EMBODIMENTS

In so-called non-light emission processing in which a radical reaction is a main part, it is difficult to detect completion (an end point) of the processing. Although a method for detecting the end point by re-exciting an exhausted gas is disclosed, a discharge unit and a light receiving unit may be separately provided in a processing apparatus and the apparatus may be expensive and large in scale.

According to the invention, after an object to be processed is processed, a downstream exhausted gas is re-converted into plasma and emits light using a light emission detecting device provided in an intermediate portion of an exhaust pipe. The light emission detecting device integrally includes, at an atmosphere side, a light receiving unit, an gas introducing unit, and an electromagnetic field application unit, and an earth electrode at a vacuum side. Gases are specified (separated) to detect an end point of the processing.

Dielectric barrier discharge occurs in an insulation inner cylinder by introducing the exhausted gas by an ejector function and the dielectric barrier discharge is collected from the atmosphere side. The invention provides a detecting method and a detecting device of gas components that have high light receiving efficiency in a compact manner.

The invention provides, in the method for detecting a light emission of plasma formed by re-excitation downstream of an arrangement position of the object to be processed, a structure of a plasma source that is good in maintenance of a discharge unit, can prevent deposits, and has sufficient active energy for efficient light collection. In addition, the invention provides a detecting method and a detecting device that have high efficiency and a processing apparatus using the detecting device.

First, the dielectric barrier discharge disclosed in PTL 4 is used for a plasma source used to form plasma by re-excitation. Plasma is generated in a cell and a beam of the plasma is brought into contact with other gases or materials to obtain an excited light emission spectrum and determine an end point by analyzing gas components. However, in order to more actively introduce the exhausted gas into plasma at this time, discharge is mainly performed at a nozzle structure, a gas inlet, and a gas diffusion portion that constitute a so-called ejector structure.

The ejector structure of a discharge unit causes the exhausted gas to be suctioned into the plasma to emit light efficiently. An over-time change in light emission intensity of a specified spectrum (a wavelength) may be followed to detect gases.

When, for example, helium (He) is mixed in an introduced gas, a ratio or a difference between a light emission intensity of light at any wavelength of 706.5 nm, 587.6 nm and 388.9 nm of a bright line spectrum of He ions and a light emission intensity of light at wavelength of a light emission intensity of a target exhausted gas component (for example, 400.9 nm, 407.4 nm and 429.5 nm of tungsten W) is detected as an index, and a change in gas concentration (a progressing state of etching) and an end point of the etching can be detected.

There is no change in a matter, as disclosed in PTL 4, that the introduced gas is "preferably an inert gas and includes argon, helium, nitrogen, xenon, krypton, neon, or a mixture thereof". In addition to these inert gases, it is effective to include oxygen in the introduced gas and place the discharge unit in an oxidizing atmosphere since deposits can be efficiently prevented by processing (such as resist asking).

However, a light collecting unit is provided upstream of the discharge unit including the ejector structure, that is, on an end surface at a side where the inert gases are introduced. The inert gas constantly flows to reduce a chance that an exhausted gas including an unreacted gas is brought into contact with a view port for light collection, prevent surface roughness or contamination (prevent a deteriorated layer from generating), and further prevent deposits from generating on a surface. At the same time, cylindrical plasma light formed in a cylindrical cell can be efficiently received. At this time, reflected light from a dielectric surface that forms a discharge unit also contributes to an increase in an amount of light collection.

A light emission of a reactive gas that is excited by plasma and diffuses to an outside of the cell as a plasma flow (a plasma torch) is formed at a tip end of the cell, and the light also passes through a cylindrical portion in the cell, so that the light can be efficiently collected by a most upstream light collection unit.

Generally, a metal that is an electrode in the dielectric barrier discharge would not be worn out since the metal is not exposed in plasma. A dielectric (such as quartz, alumina, and yttria) covering the electrode may be worn out. If only the dielectric on a surface of the discharge unit is used as a consumable, operation efficiency is good.

As described above, the dielectric barrier discharge using the introduced gas such as the inert gas has a function of introducing the exhausted gas by the ejector function, and discharged light of the dielectric barrier discharge is collected from a port provided upstream of the introduced gas. Accordingly, a gas detection can be efficiently implemented using the OES and an endpoint determination method and device can be implemented.

Although the dielectric barrier discharge is described as an example in the invention, a method for collecting light from the view port provided upstream of a supply gas by causing mainly the supply gas to discharge in a longitudinal direction in a cylinder is not limited to the dielectric barrier discharge. It is needless to say that other discharge methods (such as capacitive coupled plasma (CCP), inductively coupled plasma (ICP), microwave discharge, and magnetron discharge) can be used.

Hereinafter, embodiments of the invention will be described with reference to the drawings.

First Embodiment

The first embodiment of the invention describes a detecting method and a detecting device of gas components and a processing apparatus using the detecting device.

FIG. 1 is a block diagram showing a schematic configuration of the processing apparatus according to the present embodiment. A processing apparatus 100 according to the present embodiment processes an object to be processed by using a processing gas that is excited in plasma in processing such as etching, CVD, asking, and surface modification. The processing apparatus 100 includes a processing apparatus main body 110 that is provided with a mounting table 111 therein on which a target processing sample 101 (an object to be processed) is placed, an exhaust pump 113 that maintains a desired pressure state by exhausting an inside of the processing apparatus main body, and a main exhaust pipe 112 that exhausts a gas or a reaction product in the processing apparatus main body 110. A pressure adjusting unit 145, a main pipe gate valve 146, and a detecting device of gas components 150 according to the invention are provided in an intermediate portion of the main exhaust pipe 112. The main exhaust pipe 112 is connected to the exhaust pump 113 via a discharge pipe 152. When the processing gas is supplied from a gas supply unit 120 and power is supplied to a plasma generation source 130 that is maintained at a desired pressure to generate plasma, the generated plasma is diffused into the processing apparatus main body 110, and processing of the sample 101 placed on the mounting table 111 is started. The mounting table 111 includes a temperature control unit 140 that controls temperature.

The processing apparatus main body 110 according to the present embodiment is further connected to an exhaust unit 115 via an introduction pipe 151 including an introduction pipe gate valve 184. The exhaust unit 115 may be a pump such as a turbo molecular pump that has a large exhaust amount and is used to form a low pressure. The introduction pipe gate valve 184 includes a valve body for sealing whose opening degree can be changed to adjust pressure. A second detecting device of gas components 150' is provided downstream of the exhaust unit 115. A gas discharged from a discharge pipe 153 is connected to the exhaust pump 113 via the discharge pipe 152. Light collected by the detecting devices of gas components 150 and 150' is respectively introduced to spectrometers 4-1 and 4-1' via quartz fibers 4 and 4'. Light is separated and detected at the spectrometers and is converted into an electric signal.

The processing apparatus 100 according to the present embodiment is controlled by a control unit 160. That is, the gas supply unit 120, the plasma generation source 130, the mounting table 111 that controls conveyance of the sample 101, the temperature control unit 140, the pressure adjusting unit 145, the main pipe gate valve 146, the introduction pipe gate valve 184, the exhaust unit 115, the detecting devices of gas components 150 and 150', the spectrometers 4-1 and 4-1', and the exhaust pump 113 are directly or indirectly connected to the control unit 160, separately, and are controlled by the control unit 160. A state in which the control unit 160 is connected to each control destination element is omitted in FIG. 1. The control unit 160 may be connected to an upper level control system (not shown) via a communication line or the like.

A configuration shown in FIG. 1 is an example and what is defined in the present patent is not limited thereto.

In the processing apparatus 100 having the configuration shown in FIG. 1, first, the sample 101 to be processed is placed on the mounting table 111 using a conveying mechanism (not shown) for the entire system under a reduced pressure, and the temperature control unit 140 starts to control the sample 101 to a predetermined temperature. A gate valve (not shown) or the like that is opened at the time of conveyance is closed to isolate an inside of the processing apparatus main body 110 from the conveying mechanism. Next, whether exhaust is performed through a path of the main exhaust pipe 112 or through a path at a low vacuum side of the introduction pipe 151 is switched according to a set recipe, and a gate valve at a side of an unused path is closed. The processing gas is supplied from the gas supply unit 120 to the inside of the processing apparatus main body 110. At the same time, the detecting device of gas components 150 or 150' according to the invention is operated to generate plasma inside the processing apparatus main body 110. When the inside of the processing apparatus main body 110 is maintained at a desired pressure and the sample 101 is controlled at a predetermined temperature, electric power (an application device is not shown) is supplied to the plasma generation source 130 and the plasma generation source 130 is operated to generate plasma. Components of the generated plasma diffuse into the inside of the processing apparatus main body 110.

A surface of the sample 101 that is placed on the mounting table 111 is etched by a competitive reaction between radicals or ions that are formed by the plasma and unreacted neutral particles in a gas phase or gas adsorbed on the surface. A post-processing gas that is separated from the surface of the sample 101 contains constituent particles (elements or molecules) of the sample 101 and reflects a state of the surface (such as disappearance from a surface of an etching target film). Components of the processing gas (an etchant such as chlorine or fluorine) increase or decrease according to the state of the surface of the sample 101. The post-processing gas exhausted from the inside of the processing apparatus main body 110 is introduced into the detecting device of gas components 150 or 150', and finally discharged by the exhaust pump 113.

At this time, a plasma forming power source 22-2 is turned on to apply electric power to the detecting device of gas components 150 or 150' and a part of the post-processing gas that is introduced into the detecting device of gas components 150 or 150' emits light. Components of the light are analyzed by spectrometer 4-1 or 4-1'. An analyzed result is sent to the control unit 160.

The control unit 160 detects an end point of the etching processing by processing an over-time change in the gas components analysis according to an algorithm stored in advance. When the processing according to the recipe is completed, the supply of the electric power to the plasma generation source 130 is stopped, the plasma is extinguished, then the supply of the processing gas is stopped, and processing of the surface of the sample 101 is completed. At this time, the plasma forming power source 22-2 of the detecting device of gas components 150 or 150' according to the invention may be stopped to extinguish the plasma, or may be operated to form plasma until processing of a subsequent sample. When the sample 101 reaches a specified temperature at which the sample 101 is conveyable, the sample 101 is conveyed out from the processing apparatus main body 110 and the subsequent sample is conveyed in. These pieces of processing may be repeated, and a plurality of pieces of processing may be continuously performed.

According to the present embodiment, since the detecting device of gas components 150 or 150' can efficiently detect components of the post-processing gas, an end point of plasma processing of the surface of the sample 101 can be accurately detected. The detecting devices of gas components 150 and 150' according to the invention are provided in separated paths of the exhaust system. Alternatively, the paths of the detecting devices of gas components 150 and 150' may be joined with each other, that is, the detecting device of gas components 150 is provided upstream of the exhaust pump 113. Even in such a case, the same effect obtained and functions described in the invention can be obtained.

Second Embodiment

The second embodiment describes a specific configuration of the detecting device of gas components 150 or 150' described in the first embodiment and a detecting method of gas components using the detecting device of gas components 150 or 150'.

FIG. 2 shows a configuration provided on an exhaust path downstream of the sample 101 (see FIG. 1) which is an object to be processed and is placed on the mounting table 111 inside of the processing apparatus main body 110 of the processing apparatus 100 (see FIG. 1). The detecting device of gas components 150 or 150' includes an atmosphere unit 155 and a vacuum unit 156.

Inside the processing apparatus main body 110, a post-processing gas containing an unreacted processing gas and a reaction product is introduced from the introduction pipe 151 that is connected to the main exhaust pipe 112 via a KF flange 44 (inlet) on a right hand side in FIG. 2 and is suctioned from a KF flange 45 (outlet) on a lower side in FIG. 2. The KF flanges 44 and 45 form a part of the main exhaust pipe 112 or the discharge pipe 153 (see FIG. 1) by quick couplers 46 and 47, respectively.

In FIG. 2, the KF flanges 44 and 45 form an exhaust pipe portion that has a so-called L-shaped elbow shape at an exhaust pipe 41, and form a casing for inserting and attaching the detecting device of gas components 150 or 150' (see FIG. 1) towards the downstream. The detecting device of gas components 150 or 150' is attached in such a manner as shown in FIG. 2. Alternatively, an attachment port is not limited to the L-shaped elbow shape.

In FIG. 2, an attachment port of the detecting device of gas components 150 or 150' (see FIG. 1) according to the invention is on an upper portion in FIG. 2 that is a side opposite to the KF flange (outlet) 45. The detecting device of gas components 150 or 150' (see FIG. 1) is assembled such that the atmosphere unit 155 assembled to a ground head nozzle 36 is blocked from a vacuum side (a reduced pressure side) by using an O-ring 33 provided in the ground head nozzle 36 as a shaft seal.

Components of the atmosphere unit 155 will be described below. 1 denotes a light receiving portion case, 2 denotes a mirror, 3 denotes a collimator, and 4 denotes a quartz fiber. The mirror 2 and the collimator 3 are accommodated in the light receiving portion case 1. The quartz fiber 4 is connected to a light receiving element (not shown) of the spectrometer 4-1, and has a function of extracting a light intensity of each wavelength as an electric signal.

The electric signal corresponding to the light intensity of each wavelength extracted by the spectrometer 4-1 is sent to the control unit 160, and an end point of plasma processing of the sample 101 inside the processing apparatus main body 110 is detected.

9 denotes a light collection port and is formed of quartz or light transmissive alumina. A periphery of the light collection port 9 is shaft-sealed with an O-ring 11. 8 denotes a port presser and is provided with a through hole 8-1 for light collection.

7 denotes a base gas introduction unit and supplies an introduced gas into a lower portion of the light collection port 9 through a gas introduction hole 7-1 that is formed in a flange 13. Generally, the base gas introduction unit 7 introduces an argon (Ar) gas that is mixed with helium (He) and is restricted to a constant flow rate via a mass flow controller (MFC, not shown). An introduced gas is the argon (Ar) gas mixed with helium (He) in the present embodiment. Alternatively, the introduced gas may be the argon gas alone, or nitrogen, xenon, krypton, neon, or a mixed gas thereof, or oxygen. A gas that provides a required energy level is selected as the introduced gas.

A space between the flange 13 and a first insulator 17 is sealed with an O-ring 12. The first insulator 17 electrically insulates an upper portion of a first nozzle 29 and an electrode case 15. A space between the flange 13 and the base gas introduction unit 7 is sealed with an O-ring 10.

The detecting device of gas components 150 is provided with the first nozzle 29 and a second nozzle 32. The first nozzle 29 includes a through hole 291 that is on the same axis with an optical axis center of the mirror 2 and the through hole 8-1 of the port presser 8. The first nozzle 29 and the second nozzle 32 are formed of a dielectric material such as alumina, light transmissive alumina, aluminum nitride, or quartz. The first nozzle 29 includes an introduced gas orifice 29-3 to increase a flow velocity of the introduced gas supplied from the base gas introduction unit 7 and prevent the post-processing gas or particles that constitute plasma from returning to the light collection port 9 side.

An outer side of the first nozzle 29 between an upper O-ring 18 and a lower O-ring 33 is at an atmosphere pressure. At the outer side of the first nozzle 29, an electrode 26 is provided on an outer periphery of the first nozzle 29 by using an upper center ring member 27 and a lower center ring member 28. An innermost surface of the electrode 26 and a surface of the through hole 291 inside the first nozzle 29 are kept at a constant distance to form an electromagnetic field application electrode forming portion 29-1.

The upper center ring member 27 and the lower center ring member 28 are formed of an O-ring fluorine resin so as to be substantially concentric and a distance between the surface of the through hole 291 where plasma is formed and a metal surface of the electrode 26 on the outer periphery of the first nozzle 29 would not vary in a circumferential direction. The upper center ring member 27 and the lower center ring member 28 are not limited to the fluorine resin as long as this object can be achieved. In order to increase impedance with respect to the ground at an upper portion of the first nozzle 29, a periphery of the first insulator 17 and the electrode 26 is provided with a large spatial distance and a large creepage distance around a second insulator 19 and a third insulator 20.

The electrode 26 is connected to an introduction cable 22-1 and the plasma forming power source 22-2 via a conductive shaft 25, a copper plate 23, and a connector 22. It is needless to say that a matching network circuit (not shown) may be provided outside the connector 22 for the purpose of radio frequency phase adjustment. The plasma forming power source 22-2 is connected to the control unit 160 and is controlled by the control unit 160.

The conductive shaft 25 is electrically insulated from the electrode case 15 by an insulation member 21. A detachable lid 24 is attached to the electrode case 15. The conductive shaft 25 and the copper plate 23 can be attached to or detached from the electrode case 15 in a state in which the lid 24 is detached from the electrode case 15.

Next, components of the vacuum unit 156 will be described below.

The second nozzle 32 does not include a seal portion from an atmosphere and is entirely provided in an atmosphere of the vacuum unit 156. The second nozzle 32 is positioned to be coaxial with the first nozzle 29 by a center ring member 40 near a tip end of a ground electrode forming portion 29-2. The purpose of positioning the second nozzle 32 to be coaxial with the first nozzle 29 is to prevent an occurrence of a difference in impedance in the circumferential direction on an inner wall of the second nozzle 32 and prevent discharge from continuing and concentrating at a specific position. Although the center ring member 40 is formed of an O-ring fluorine resin, the center ring member 40 is not limited to a fluorine resin material. It is needless to say that the ground electrode forming portion 29-2 is provided at a tip end of the second nozzle 32 as a ground electrode having smallest plasma impedance as viewed from the electromagnetic field application electrode forming portion 29-1. A gas suction ejector forming portion 29-4 is formed by a lowermost portion of the first nozzle 29, an upper portion of the second nozzle 32 that is inserted into the lowermost portion of the first nozzle 29, and an insulator bush 37. The insulator bush 37 is fixed to the ground head nozzle 36 using a retaining screw 38. A part of the post-processing gas introduced from the KF flange 44 is suctioned from an opening 37-1 of the insulator bush 37 due to gas viscosity and is drawn into a suction space 32-1.

In order to prevent electromagnetic leakage from the atmosphere unit 155 and the vacuum unit 156 shown in FIG. 2, portions that have to be sealed in a relatively large area include a first electromagnetic shielding line 16, a second electromagnetic shielding line 35, and a third electromagnetic shielding line 39. Although the first electromagnetic shielding line 16, the second electromagnetic shielding line 35, and the third electromagnetic shielding line 39 have an electric sealing property, the first electromagnetic shielding line 16, the second electromagnetic shielding line 35, and the third electromagnetic shielding line 39 usually do not function as a vacuum sealing material.

Next, the detecting method of gas components and operation of the detecting device of gas components according to the present embodiment will be described with reference to FIG. 2. From the perspective of safety and equipment protection, an interlock is provided in the control unit 160 to prevent the plasma forming power source 22-2 that is used for the detecting device of gas components 150 according to the present embodiment from being turned on when the plasma forming power source 22-2 is not in vacuum, which is similar to power (an application device is not shown) used for the plasma generation source 130 that forms plasma to process the sample 101.

When a supply amount or control pressure of a combustible gas or a flammable gas that is supplied from the gas supply unit 120 is not appropriate, the plasma forming power source 22-2 for dielectric barrier discharge according to the present embodiment can not be turned on to further ensure safety. Although it is not shown in FIG. 2, an explosion-proof function such as purging the inside of the detecting device of gas components 150 or entire pipes on which the detecting device of gas components 150 is provided with an inert gas such as nitrogen.

The plasma forming power source 22-2 can be provided with a radio frequency power source of 10 KHz to 1000 MHz. In the present embodiment, a radio frequency power source of 400 KHz with an output of 300 W is provided. The gas introduced from the base gas introduction unit 7 is supplied at a flow rate of 5 ml/min to 1000 ml/min in terms of an atmosphere pressure. This flow rate is optimized so that stable discharge can be obtained for each processing condition of the processing recipe. Since an introduced gas is introduced through the gas introduction hole 7-1 from the base gas introduction unit 7 and is narrowed by the introduced gas orifice 29-3 of the first nozzle 29, a flow velocity of the introduced gas increases after the introduced gas passes through the introduced gas orifice 29-3. The plasma forming power source 22-2 of the detecting device of gas components 150 according to the present embodiment is operated at the same time with or before a start of the processing recipe of the sample 101 which is an object to be processed inside the processing apparatus main body 110. Accordingly, so-called dielectric barrier discharge occurs between the electromagnetic field application electrode forming portion 29-1 and the ground electrode forming portion 29-2.

A processing gas supplied from the gas supply unit 120 to the inside of the processing apparatus main body 110 is excited by electric power supplied to the plasma generation source 130, diffuses into the processing apparatus main body 110, and processes the sample 101 placed on the mounting table 111. A post-processing gas is discharged from the main exhaust pipe 112 by the exhaust pump 113. Alternatively, a drive unit A drives the main pipe gate valve 146 to close and a drive unit M drives the introduction pipe gate valve 184 to open in accordance with a recipe so as to switch to a path passing the exhaust unit 115. A part of the exhausted post-processing gas is suctioned from the opening 37-1 of the detecting device of gas components 150 or 150' and is added to plasma of the dielectric barrier discharge.

The plasma formed by the discharge has a high plasma density and a high plasma potential. The plasma excites or ionizes Ar or He in the introduced gas, or cracks and excites molecules of the post-processing gas inside the processing apparatus main body 110 introduced from the gas suction ejector forming portion 29-4. For example, light is emitted by energy of a difference between a case where He receives an electron from a $He^+$ ion and returns to a neutral particle and a case where an electron falls in a trajectory lower than a trajectory where He is excited as a He radical. Energy of the light is also used to crack the post-processing gas or excite the post-processing gas into radicals. Excitation may be performed from He for the purpose of detecting an end point.

Light emitted when He molecules or other gas molecules are combined or return to a ground state is extracted to the atmosphere through the through hole 32-1 of the second nozzle 32, the through hole 291 of the first nozzle 29, the introduced gas orifice 29-3, and the light collection port 9, and is received through the through hole 8-1 of the port presser 8, the mirror 2, the collimator 3, and the quartz fiber 4. Since a lower side (the first nozzle 29 side) that is not an atmosphere side of the light collection port 9 is filled with He and does not come into contact with a reaction product or other gas molecules, the light collection port 9 can be stably used for a long period of time without reducing an amount of transmitted light.

That is, according to the present embodiment, an inert gas is introduced from the base gas introduction unit 7 into a space between the light collection port 9 and an introduced gas plasma forming region 50 and the introduced gas orifice 29-3 is provided, so that plasma generated in the introduced gas plasma forming region 50 does not reach the light collection port 9. Accordingly, the light collection port 9 can be prevented from deterioration due to plasma, and light substantially equivalent to a light emission of the plasma in the introduced gas plasma forming region 50 can be stably received through the light collection port 9.

FIG. 2 is a schematic view showing the introduced gas plasma forming region 50 and an exhausted gas suction region 51. As shown in the figure, the introduced gas plasma forming region 50 also extends to a lower space portion of the second nozzle 32 at a tip end of the ground head nozzle 36 depending on a plasma forming condition. When modules are recombined or return to a ground state, light is emitted in the introduced gas plasma forming region 50. At this time, light collection can be efficiently performed though the through hole 8-1, the mirror 2, the collimator 3, and the quartz fiber 4 from a direction along the through holes 32-1 and 291 and the light collection port 9, and the light can be detected by the spectrometer 4-1.

Plasma is formed between the electromagnetic field application electrode forming portion 29-1 and the ground electrode forming portion 29-2. A large number of ions or electrons of charged particles are present at a position between the electromagnetic field application electrode forming portion 29-1 and the ground electrode forming portion 29-2. Since an inner wall of the through hole 291 of the first nozzle 29 and an inner wall of the through hole 32-1 of the second nozzle 32 can be appropriately heated by being emitted or radiated with the charged particles, deposits can be prevented from generating on wall surfaces of the through holes 291 and 32-1. In addition, since the electrode 26 of the electromagnetic field application electrode forming portion 29-1 is provided on the atmosphere side, heat can be dissipated appropriately and temperature of the electrode 26 can be prevented from excessively increasing.

The tip end of the ground head nozzle 36 is narrowed and has a structure that does not block an exhaust flow of the post-processing gas and does not excessively reduce an exhaust velocity compared to a general L-shaped exhaust pipe (a type of a pipe curved by 90 degrees).

The spectrometer 4-1 detects light that is emitted in the introduced gas plasma forming region 50 and is sent via the quartz fiber 4. An electric signal corresponding to light intensity of each wavelength is extracted and sent to the control unit 160. An endpoint of the plasma processing of the sample 101 inside the processing apparatus main body 110 is detected according to a processing algorithm. At this time, the light that is emitted in the introduced gas plasma forming region 50 and is sent via the quartz fiber 4 hardly deteriorates signal intensity at the quartz fiber 4 due to an over-time change from the introduced gas plasma forming region 50 by configuring the detecting device of gas components 150 as above. As a result, the spectrometer 4-1 can receive light substantially equivalent to the light emitted in the introduced gas plasma forming region 50 from the quartz fiber 4.

In this manner, the control unit 160 receives an output signal of the spectrometer 4-1 that detects the light emitted in the introduced gas plasma forming region 50 and follows an over-time change of light emission intensity of a specified spectrum (a wavelength), so that gas components can be detected. As a result of detecting the gas components, an end point of processing in the processing apparatus, for example, an end point of etching processing can be detected.

When, for example, helium (He) is used as an introduced gas, a ratio of a light emission intensity of a bright line spectrum of He ions and a light emission intensity of light of wavelengths of target exhausted gas components or a difference between the light emission intensities is detected as an index, so that gas components can be efficiently detected, for example, a change in gas concentration (a progressing state of etching) can be detected. As a result of detecting the gas components, an end point of processing in the processing apparatus, for example, an endpoint of the etching processing can be detected.

Accordingly, an end point of plasma processing of the sample 101 inside the processing apparatus main body 110 can be accurately detected for each processing using a detecting device of gas components that has a relatively simple configuration, and quality of plasma processing can be maintained uniform.

According to the present embodiment, exhausted gas components are formed into plasma by additional dielectric barrier discharge or the like that is provided downstream of the object to be processed, and a light emission by the exhausted gas components is collected and detected upstream of an introduced gas in the discharge unit. The ejector function actively introduces the exhausted gas into plasma. Accordingly, in processing of the object to be processed in which a radical reaction is a main part, a progressing state of the reaction and an end point can be efficiently detected without a time lag, and an S/N ratio can be improved.

Third Embodiment

Another embodiment of the atmosphere unit 155 of the detecting device of gas components 150 described in the second embodiment will be described with reference to FIG. 3. Since a configuration and operation of a detecting device of gas components 1551 shown in FIG. 3 are substantially the same as a configuration and operation of the detecting device of gas components 150 described with reference to FIG. 2 according to the second embodiment, the same component numbers are as signed to portions that are the same as portions of the atmosphere unit 155 described in FIG. 2, and a description thereof will be omitted.

The configuration shown in FIG. 3 is different from the configuration shown in FIG. 2 in that the first nozzle 29 in FIG. 2 is divided into a nozzle (1) 30 and a nozzle (2) 31. In FIG. 3, the nozzle (1) 30 is formed of quartz and the nozzle (2) 31 is formed of light transmissive alumina. Compared with alumina, quartz has good processability to form an introduced gas orifice 31-1 and can reduce a performance difference in detecting a light emission between devices when a plurality of devices are manufactured. Although the nozzle (1) 30 is formed of quartz in FIG. 3, the entire function is the same as the apparatus in FIG. 2 and plasma light can be collected by re-excitation in a similar manner.

The present embodiment has the same effect as the second embodiment. In addition, the present embodiment can provide the detecting device of gas components 150 that can reduce a performance difference in detecting a light emission between devices.

INDUSTRIAL APPLICABILITY

The invention is applied to detect an end point of processing by a processing apparatus in a process in which the processing apparatus uses a processing gas to process a wafer in a manufacturing process of a semiconductor device.

REFERENCE SIGN LIST 1 light receiving portion case
2 mirror
3 collimator
4 quartz fiber
4-1 spectrometer
7 base gas introduction portion
8 port presser
9 light collection port
13 flange
15 electrode case
22-2 plasma forming power source
25 conductive shaft
26 electrode
29 first nozzle
29-1 electromagnetic field application electrode forming portion
29-2 ground electrode forming portion
29-3 introduced gas orifice
29-4 gas suction ejector forming portion
30 nozzle (1)
31 nozzle (2)
32 second nozzle
36 ground head nozzle
41 exhaust pipe
100 processing apparatus
110 processing apparatus main body
112 main exhaust pipe
113 exhaust pump
115 exhaust unit
120 gas supply unit 130 plasma generation source
150, 150', 1551 detecting device of gas components
155 atmosphere unit
156 vacuum unit

The invention claimed is:

1. A detecting method of gas components for detecting, using a detecting device of gas components, components of a gas to be analyzed that is exhausted from a processing apparatus and flows through an exhaust pipe portion, wherein the detecting device of gas components includes a nozzle portion, a hole that passes through the nozzle portion, a light emission detecting unit disposed at an opposite end portion of the hole with respect to one end of the hole in the nozzle portion, and an introduced gas supply portion disposed between the light emission detecting unit and the nozzle portion, the detecting method of gas components comprising:

introducing an introduced gas, into an inside of the hole that passes through the nozzle portion of the detecting device of gas components, from the introduced gas supply portion of the detecting device of gas components;

introducing a part of the gas to be analyzed that flows through the exhaust pipe portion into the inside of the hole from an opening provided in an intermediate portion of the hole between said one end of the hole in the nozzle portion and the introduced gas supply portion;

generating a plasma, using the gas to be analyzed and the introduced gas, by a discharge electrode of the detecting device of gas components discharging in a region including a section where the gas to be analyzed is introduced from the opening and the inside of the hole of the nozzle portion;

detecting a light emission of the generated plasma passing through the hole of the nozzle portion by the light emission detecting unit of the detecting device of gas components; and detecting the components of the gas to be analyzed based on information of the light emission of the plasma that is detected by the light emission detecting unit.

2. The detecting method of gas components according to claim 1, wherein the light emission detecting unit detects the light emission of the plasma generated inside the nozzle portion via a light collection port through which light transmits.

3. The detecting method of gas components according to claim 2, wherein the introduced gas supply portion supplies the introduced gas from a space between the opening and the light collection port into the inside of the nozzle portion.

4. The detecting method of gas components according to claim 2, wherein an orifice is formed at a narrow portion between a side where the light collection port is provided and the opening in the hole of the nozzle portion, and the introduced gas supplied from the introduced gas supply portion is supplied through the orifice to a side where the opening is formed.

5. The detecting method of gas components according to claim 1, wherein an exhaust pump exhausts the gas to be analyzed from the exhaust pipe portion and the part of the gas to be analyzed is introduced from the opening that is formed in the nozzle portion into the inside of the hole.

* * * * *